United States Patent [19]

Hur

[11] Patent Number: 5,658,696
[45] Date of Patent: Aug. 19, 1997

[54] PHASE SHIFT MASK

[75] Inventor: Ik Boun Hur, Kyoungki-do, Rep. of Korea

[73] Assignee: Hyundai Electronics Industries Co., Ltd., Kyoungki-do, Rep. of Korea

[21] Appl. No.: 524,586

[22] Filed: Sep. 8, 1995

[30] Foreign Application Priority Data

Sep. 9, 1994 [KR] Rep. of Korea ............... 94-22730

[51] Int. Cl.⁶ ............................................. G03F 9/00
[52] U.S. Cl. ..................................... 430/5; 430/22
[58] Field of Search ...................... 430/5, 22; 356/399, 356/401

[56] References Cited

U.S. PATENT DOCUMENTS 5,262,258  11/1993  Yanagisawa ........................... 430/22
5,538,819   7/1996  DeMarco et al. ...................... 430/22

Primary Examiner—S. Rosasco
Attorney, Agent, or Firm—Reid & Priest LLP

[57] ABSTRACT

A phase shift mask, having a vernier or box-in-box pattern in an area corresponding to the scribe line of a wafer, allowing the degree of overlap between the light screen pattern and the phase shift film pattern to be accurately examined during wafer processing, whereby the product yield and the reliability can be much improved.

6 Claims, 2 Drawing Sheets

PHASE SHIFT MASK

BACKGROUND OF THE INVENTION

1. Field of the Invention

The present invention relates, in general, to a phase shift mask and, more particularly, to a phase shift mask which is a vernier or box-in-box pattern type such that the degree of overlap between the light screen pattern and the phase shift film pattern can be examined accurately, thereby improving product yield and reliability.

2. Description of the Prior Art

Following the recent trend in semiconductor devices to be simple, thin, light and compact, the size of unit devices, such as transistors and capacitors, should be reduced along with the distance between wires. As topology in semiconductor device increases, the fineness of pattern is accelerated.

A typical exposure mask that is used at an exposing step to form a photosensitive film pattern is prepared by coating a light screen film, such as a chrome or an aluminum layer, on a substrate and patterning the light screen film by means of ion beam etching. However, it is difficult to form a fine pattern smaller than light resolution by use of the typical mask. Indeed, it is virtually impossible to obtain a fine pattern with a width of µm or less by use of current photosensitive solutions and light exposing equipment, for example, G line (436 nm) or I line (365 nm) steppers.

In addition, very highly integrated semiconductor devices, such as 64M DRAM, demand a fine pattern with a width smaller than 0.5 µm. Various efforts have been made to meet such a demand. In an effort to develop highly integrated semiconductor devices, phase shift masks were invented. In fact, the ultrafine pattern is accomplished by use of phase shift masks.

A phase shift mask is essentially composed broadly of a light screen pattern and a phase shift film pattern. The phase shift film pattern plays the role of shifting an incident beam at an angle of 180° or 90°. Such a phase shift mask is designed to keep the amplitude of the light illuminated on the wafer constant at the exposing step and to minimize the exposure effect caused by interference between a beam passing through one line of the phase shift pattern and another beam passing through another line adjacent to the one line, thereby improving the resolution of the photosensitive film pattern.

In order to improve the contrast ratio of a light illuminated on a photosensitive film, the phase shift film is so thick as to shift the phase of the light at an angle of 160° to 200°. For example, where an incident beam is of G or I line and the phase shift material is spin-on-glass (hereinafter referred to as "SOG"), an oxide or a nitride, the phase shift film has a thickness ranging from 3,400 to 4,000 Angstrom. Such a phase shift mask allows the lines of the pattern to have a width of 0.5 µm or less even when conventional photosensitive films and light exposing equipments are employed.

Now, in order to better understand the background of the present invention, a description of conventional repetitive phase shift masks will be presented in connection with FIGS. 1 to 3.

First, referring to FIG. 1, there is shown a conventional example or a space frequency-modulating phase shift mask. As shown in this figure, a plurality of light screen film patterns 2 is formed on a quartz substrate 1. The chrome patterns are arranged so that each of them has a predetermined width and are uniformly separated. A plurality of phase shift film patterns 3 is also formed on every other space between the light screen patterns 2.

FIG. 2 shows another example of a space frequency-modulating phase shift mask. As shown in FIG. 2, a phase shift film pattern 3 is formed on a quartz substrate 1. A plurality of light screen film patterns 2 is formed on the phase shift film pattern, arranged so that each of them has a predetermined width and is uniformly separated. Every other space of the phase shift film pattern's areas corresponding to the space between the light screen film patterns may be removed. Thus, the quartz substrate 1 is correspondingly exposed.

Referring to FIG. 3, there is also another example of a phase shift mask. It is designed to Shift the phase of light in accordance with the thickness of the quartz substrate by removing to a predetermined depth every other part of the quartz substrate 1 corresponding to the space between light screen film patterns.

In a phase shift mask, the light screen film pattern is generally formed so as to overlap with the phase shift film patterns to some degree. Since the degree of overlap is a very important factor that affects the performance of phase shift mask, for example, resolution and depth of focus it is important to ascertain the accuracy of the degree of overlap prior to subsequent wafer processing.

Without separate equipment, the accuracy of the overlap degree is difficult to ascertain in conventional phase shift mask structures because the light passing through the quartz substrate and the light passing through the phase shift film pattern both have a transmission of almost one.

SUMMARY OF THE INVENTION

Accordingly, it is a principal object of the present invention to overcome the above problem encountered in the prior art and to provide a phase shift mask having a vernier or box-in-box pattern, which allow the degree of overlap between the light screen pattern and the phase shift film pattern to be accurately examined during wafer processing.

In accordance with an aspect of the present invention, there is provided a phase shift mask, comprising: a light screen pattern having a plurality of predetermined lines/spaces which is formed at a part of a transparent substrate; and a plurality of upper and lower phase shift film patterns, which show a vernier pattern type, and each of said phase shift film patterns has the same width as the spaces of said light screen pattern being aligned in such a way that the central phase shift film pattern may completely overlap with the central space of said light screen pattern and the overlapped area of said phase shift film patterns and said light screen pattern my become larger as said phase shift film pattern is nearer to the outermost one of the light screen patterns.

In accordance with another aspect of the present invention, there is provided a phase shift mask, comprising: a light screen pattern for defining a rectangular exposure area on a quartz substrate; and a phase shift film pattern having a plurality of identical spaces, which is formed inside said defined exposure area and screen light, said grid spaces playing a role of causing the light passing therethrough to interfere with each other.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

The application of the preferred embodiments of the present invention is best understood with reference to some accompanying drawings.

Figure 1:
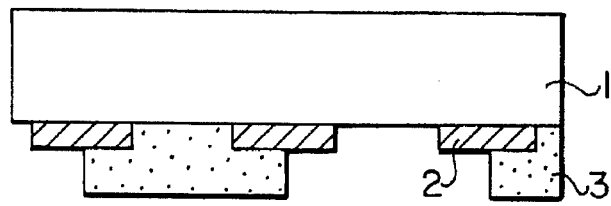
FIG. 1 is a schematic cross sectional view showing a conventional repetitive phase shift mask.
Figure 2:
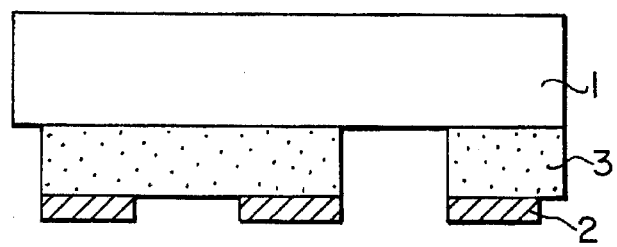
FIG. 2 is a schematic cross sectional view showing another conventional repetitive phase shift mask.
Figure 3:
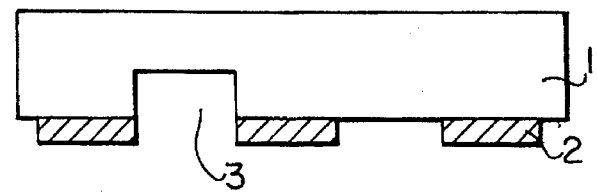
FIG. 3 is a schematic cross sectional view showing a further conventional repetitive phase shift mask.
Figure 4:
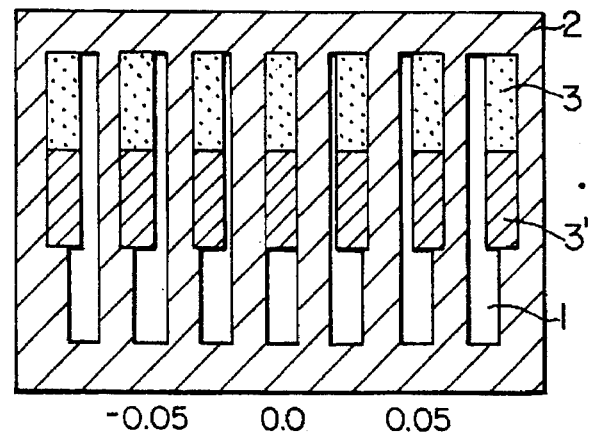
FIG. 4 is a schematic plane view showing a phase shift mask according to an embodiment of the present invention.

First, referring to FIG. 4, there is shown a phase shift mask according to an embodiment of the present invention. As shown in this drawing, a light screen film pattern 2 with predetermined line/spaces, made of chrome, is formed on an area of transparent substrate 1, for example, on the scribe line of wafer and partly covered with an upper and lower phase shift film pattern 3 and 3' which has a width as wide as the space of the light screen pattern 2.

In accordance with the present invention, the upper and lower phase shift film patterns 3 and 3' are formed of a material selected from the group consisting of oxide, nitride or SOG and their thickness is controlled to shift the phase of incident light to an angle of 180° and 90°, respectively. The space between the phase shift film patterns 3 and 3' is wider than that of the light screen pattern 2 by 0.025 µm. Also, each of the phase shift film patterns 3 and 3' is uniformly separate and aligned in such a way that the central phase shift film pattern line may be completely overlapped with the space of the light screen film pattern 2. Accordingly, the overlapped area of the phase shift film patterns 3 and 3' and the light screen pattern 2 becomes larger as the phase shift film pattern is nearer to the ends.

In a phase shift mask having such a vernier pattern, some parts other than the right screen film pattern appear bright or dark depending on the vertical position of the phase shift mask, at areas where the vernier pattern completely overlaps. On the other hand, where the vernier pattern does not completely overlap, black lines appear because the phase of light is drastically changed midway by the phase difference of the upper and lower phase shift film patterns.

In the phase shift mask according to an embodiment of the present invention, the overlapping degree of the light screen film pattern with the phase shift film pattern can therefore be determined by detecting the black lines with naked eyes or with camera equipment.

Figure 5:
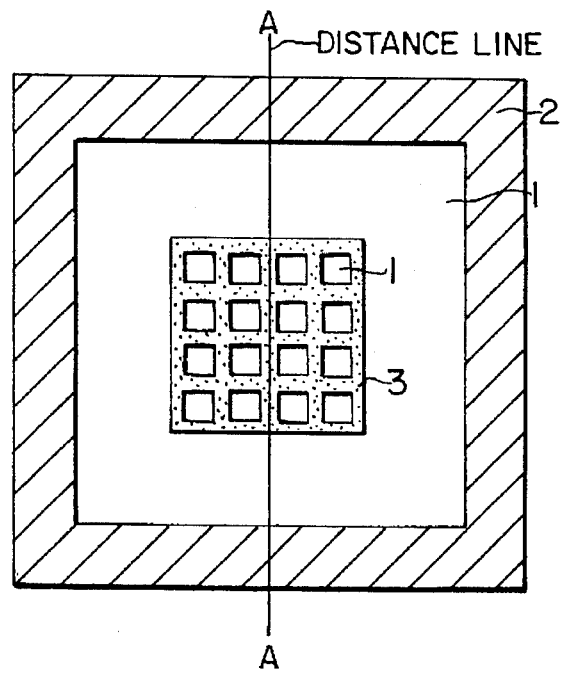
FIG. 5 is a schematic plane view showing a phase shift mask according to another embodiment of the present invention.

Referring now to FIG. 5, there is a phase shift mask according to another embodiment of the present invention. As shown in FIG. 5, the phase shirt mask comprises a rectangular light screen film pattern 2, which defines an exposure area in a part of a quartz substrate 1 corresponding to the scribe line of a semiconductor device, and a phase shift film pattern 3 which is formed inside the exposure area and has a plurality of identical grid spaces 8 with a predetermined size.

Figure 6:
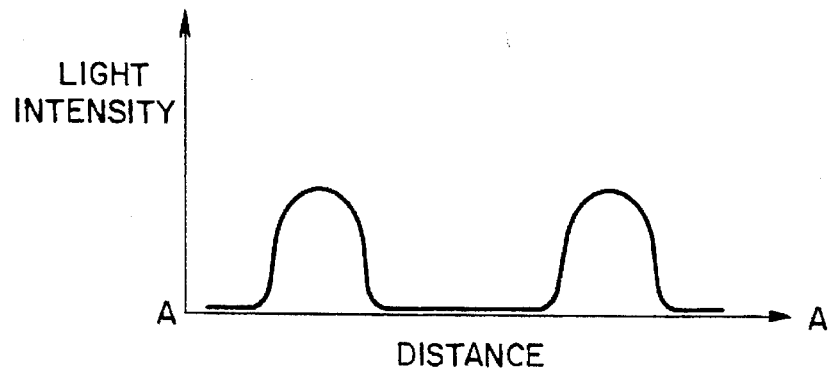
FIG. 6 is a graph in which light intensity is plotted with respect to the distance taken generally through the line A—A of FIG. 5.

A beam passing through the quartz substrate 1 corresponding to the grid spaces interfere with another beam passing through the phase shift film pattern 3, changed in phase, and thus, the intensity of light is near zero, as shown in FIG. 6. In contrast, the part outside the phase shift film pattern, corresponding to the exposure area, shows a certain intensity of light.

Figure 7:
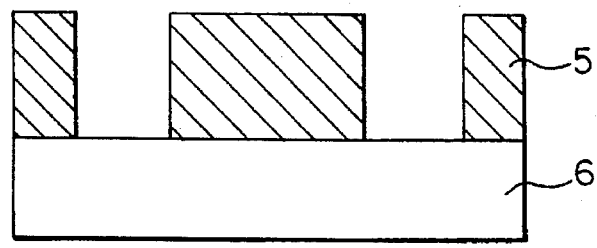
FIG. 7 is a schematic cross sectional view showing a photosensitive film pattern formed on a semiconductor device by use of the phase shift mask of FIG. 5.

FIG. 7 shows a box-in-box type photosensitive film pattern which is prepared by exposing a positive photosensitive film 5 coated on a semiconductor substrate 6 by use of the phase shift mask of FIG. 5. In this photosensitive film pattern, the overlap degree between the light screen film pattern 2 and the phase shift film pattern 3 is ascertained by observing the position of the area corresponding to the phase shift film pattern 3 with the naked eyes or with camera equipment. If the light screen film pattern 2 is overlapped with the phase shift film pattern 3 accurately, a rectangular photosensitive film pattern 5 is formed at the center of the exposure area. Otherwise, the pattern is formed obliquely.

As described hereinbefore, the phase shift mask of the present invention has a vernier or box-in-box pattern in an area corresponding to the scribe line of a wafer, allowing the degree of overlap between the light screen film pattern and the phase shift film pattern to be accurately examined during wafer processing. Consequently, the phase shift mask can bring into an advantage that the product yield and the reliability of device operation are greatly improved.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A phase shift mask, comprising:
   a transparent substrate; a light screen pattern having a plurality of lines and spaces, said light screen pattern being formed on said transparent substrate; and a plurality of upper and lower phase shift film patterns, which show a vernier pattern, and each of said phase shift film patterns having the same width as the spaces of said light screen pattern and being aligned in such a way that the central phase shift film pattern overlaps the central space of said light screen pattern; and wherein the overlapped area of said phase shift film patterns and said light screen pattern becomes larger as said phase shift film pattern is nearer to the outermost one of the light screen patterns.

2. A phase shift mask in accordance with claim 1, wherein said light screen pattern and said phase shift film pattern both are formed at the area corresponding to the scribe line of a semiconductor device.

3. A phase shift mask in accordance with claim 1, wherein said light screen pattern is formed of a chrome film.

4. A phase shift mask in accordance with claim 1, wherein said upper phase shift film pattern and said lower phase shift film pattern shift the phase of light to an angle of 180 degrees and 90 degrees, respectively.

5. A phase shift mask, comprising: a light screen pattern for defining a rectangular exposure area on a quartz substrate; and a phase shift film pattern having a plurality of identical grid spaces, said phase shift film pattern being formed inside said defined exposure area and said light screen, said grid spaces causing the light passing therethrough to interfere with itself.

6. A phase shift mask in accordance with claim 5, wherein said phase shift film pattern has a phase shift angle of 180 degrees or 90 degrees.

* * * * *